United States Patent
Du

(10) Patent No.: US 11,644,489 B2
(45) Date of Patent: May 9, 2023

(54) CURRENT RECORDING METHOD, CURRENT RECORDING DEVICE AND CURRENT RECORDING SYSTEM

(71) Applicant: Schneider Electric Industries SAS, Rueil-Malmaison (FR)

(72) Inventor: Wansen Du, Shanghai (CN)

(73) Assignee: Schneider Electric Industries SAS, Rueil-Malmaison (FR)

( * ) Notice: Subject to any disclaimer, the term of this patent is extended or adjusted under 35 U.S.C. 154(b) by 0 days.

(21) Appl. No.: 17/460,761

(22) Filed: Aug. 30, 2021

(65) Prior Publication Data
US 2022/0065903 A1    Mar. 3, 2022

(30) Foreign Application Priority Data

Sep. 3, 2020    (CN) .......................... 202010915649.1

(51) Int. Cl.
*G01R 19/25*    (2006.01)
*H04B 3/54*    (2006.01)

(52) U.S. Cl.
CPC ......... *G01R 19/2506* (2013.01); *H04B 3/542* (2013.01)

(58) Field of Classification Search
CPC ............................. G01R 19/2506; H04B 3/542
See application file for complete search history.

(56) References Cited

U.S. PATENT DOCUMENTS

| 4,723,220 A | 2/1988 | Smith-Vaniz | |
| 2014/0118000 A1* | 5/2014 | Pan | H02H 7/263 |
| | | | 324/537 |

FOREIGN PATENT DOCUMENTS

| EP | 3107168 A1 * | 12/2016 | ............. H02H 3/00 |
| EP | 3107168 A1 | 12/2016 | |
| JP | 2018011370 A * | 1/2018 | ............. H02J 13/00 |
| JP | 2018011370 A | 1/2018 | |
| WO | WO-2016029466 A1 * | 3/2016 | ............. G01R 31/08 |

OTHER PUBLICATIONS

Extended European Search Report dated Feb. 9, 2022 for corresponding European Patent Application No. 21306192.2-1010, 8 pages.

* cited by examiner

*Primary Examiner* — Alvaro E Fortich
*Assistant Examiner* — Dilara Sultana
(74) *Attorney, Agent, or Firm* — Locke Lord LLP

(57) ABSTRACT

It is provided a current recording method, a current recording device and a current recording system by the embodiments of this disclosure. The current recording method comprises: acquiring a first current Fourier value, the first current Fourier value being a Fourier value acquired by Fourier transforming an instantaneous value of current at a first end of a power line; acquiring a second current Fourier value, the second current Fourier value being a Fourier value acquired by Fourier transforming an instantaneous value of current at a second end of the power line; time-alignment the first current Fourier value and the second current Fourier value, based on a first transmission delay for acquiring the first current Fourier value and a second transmission delay for acquiring the second current Fourier value; storing the aligned first current Fourier value and second current Fourier value into a storage.

13 Claims, 11 Drawing Sheets

CURRENT RECORDING METHOD, CURRENT RECORDING DEVICE AND CURRENT RECORDING SYSTEM

TECHNICAL FIELD

The present disclosure relates to a current recording method, a current recording device and a current recording system.

BACKGROUND

According to the principle of differential protection, a protection device needs to acquire current data from each end (two or more ends) within a protection area and time-align the data. However, an error in time label for current data received by the protection device may occur due to time management of the protection device itself, or no installment of a GPS timing product, or a loss of GPS signal, thereby causing the protection device fail to determine whether a differential protection action should be triggered. Also, the protection device usually only holds data of instantaneous values of local current, which makes it difficult to conduct a post-event analysis for a differential protection action.

SUMMARY

A current recording method is provided by the embodiments of the present disclosure. The method comprises: acquiring a first current Fourier value, the first current Fourier value being a Fourier value acquired by Fourier transforming an instantaneous value of current at a first end of a power line; acquiring a second current Fourier value, the second current Fourier value being a Fourier value acquired by Fourier transforming an instantaneous value of current at a second end of the power line; time-aligning the first current Fourier value and the second current Fourier value, based on a first transmission delay for acquiring the first current Fourier value and a second transmission delay for acquiring the second current Fourier value; and storing the aligned first current Fourier value and second current Fourier value into a storage.

Optionally, the current recording method provided by the embodiments of the present disclosure is applied to a current recording device, wherein: by the current recording device, collecting the instantaneous value of the current at the first end of the power line, and converting the collected instantaneous value of the current into a Fourier value of the current to acquire the first current Fourier value; by the current recording device, acquiring the second current Fourier value from an external device which is configured to collect the instantaneous value of the current at the second end of the power line and convert the collected instantaneous value of the current into a Fourier value of the current, via a communication channel between the current recording device and the external device, and storing the aligned first current Fourier value and second current Fourier value into the storage; the first transmission delay is zero; and the second transmission delay is a transmission delay for the communication channel.

Optionally, the current recording method provided by the embodiments of the present disclosure is applied to a current recording system comprising a first current recording device, a second current recording device and a server, wherein: by the server, acquiring the first current Fourier value from the first current recording device via a first communication channel between the server and the first current recording device, the first current recording device being configured to collect the instantaneous value of the current at the first end of the power line and convert the collected instantaneous value of the current into a Fourier value of the current as the first current Fourier value; by the server, acquiring the second current Fourier value from the second current recording device via a second communication channel between the server and the second current recording device, the second current recording device being configured to collect the instantaneous value of the current at the second end of the power line and convert the collected instantaneous value of the current into a Fourier value of the current as the second current Fourier value; by the server, time-aligning the first current Fourier value and the second current Fourier value, and storing the aligned first current Fourier value and second current Fourier value into the storage; the first transmission delay is a transmission delay for the first communication channel; and the second transmission delay is a transmission delay for the second communication channel.

Optionally, when the current recording method provided by the embodiments of the present disclosure is applied to the current recording device, the second transmission delay is determined by: by the current recording device, transmitting a delay request signal to the external device via the communication channel, and storing a request transmission time at which the delay request signal is transmitted; by the current recording device, receiving a delay response signal as a response to the delay request signal from the external device, via the communication channel, and storing a delay reception time at which the delay response signal is received, the delay response signal including a request reception time at which the delay request signal is received by the external device and a response transmission time at which the delay response signal is transmitted by the external device; and by the current recording device, determining half of a value obtained by a difference between the response reception time and the request transmission time subtracting a difference between the response transmission time and the request reception time, as the second transmission delay.

Optionally, when the current recording method provided by the embodiments of the present disclosure is applied to the current recording system, the first transmission delay is obtained by: by the server, transmitting a first delay request signal to the first current recording device, via the first communication channel, and storing a first request transmission time at which the first delay request signal is transmitted; by the server, receiving a first delay response signal transmitted by the first current recording device, via the first communication channel, and storing a first response reception time at which the first delay response signal is received, the first delay response signal including a first request reception time at which the first delay request signal is received by the first current recording device and a first response transmission time at which the first delay response signal is transmitted by the first current recording device; and by the server, determining half of a value obtained by a difference between the first response reception time and the first request transmission time subtracting a difference between the first response transmission time and the first request reception time, as the first transmission delay; and the second transmission delay is obtained by: by the server, transmitting a second delay request signal to the second current recording device, via the second communication channel, and storing a second request transmission time at which the second delay request signal is transmitted; by the server, receiving a second delay response signal transmitted by the second current recording device, via the second communication channel, and storing a second response reception time at which the second delay response signal is received, the second delay response signal including a second request reception time at which the second delay request signal is received by the second current recording device and a second response transmission time at which the second delay response signal is transmitted by the second current recording device; and by the server, determining half of a value obtained by a difference between the second response reception time and the second request transmission time subtracting a difference between the second response transmission time and the second request reception time, as the second transmission delay.

Optionally, the current recording method provided by the embodiments of the present disclosure further comprises: detecting whether a vector sum of the aligned first current Fourier value and second current Fourier value starts to have a non-zero value from a certain time epoch, and storing only first current Fourier values and second current Fourier values which start from the time epoch.

Optionally, the current recording method provided by the embodiments of the present disclosure further comprises: acquiring a third current Fourier value, the third current Fourier value being a Fourier value acquired by Fourier transforming an instantaneous value of current at a third end of the power line; time-aligning the first current Fourier value, the second current Fourier value, and the third current Fourier value, based on the first transmission delay for acquiring the first current Fourier value, the second transmission delay for acquiring the second current Fourier value, and a third transmission delay for acquiring the third current Fourier value; and storing the aligned first current Fourier value, second current Fourier value, and third current Fourier value into the storage.

Optionally, the current recording method provided by the embodiments of the present disclosure, wherein the Fourier transform is performed in units of instantaneous values for one or more cyclic waves of the current, and the Fourier transform is performed once every L instantaneous values, wherein L is an integer greater than 2.

A current recording device is provided by the embodiments of the present disclosure. The device comprises: an acquisition unit, configured to acquire a first current Fourier value and a second current Fourier value, the first current Fourier value being a Fourier value acquired by Fourier transforming an instantaneous value of current at a first end of a power line, the second current Fourier value being a Fourier value acquired by Fourier transforming an instantaneous value of current at a second end of the power line; an alignment unit, configured to time-align the first current Fourier value and the second current Fourier value based on a first transmission delay for acquiring the first current Fourier value and a second transmission delay for acquiring the second current Fourier value; and a storage unit, configured to store the aligned first current Fourier value and second current Fourier value.

Optionally, the current recording device provided by the embodiments of the present disclosure, wherein: the acquisition unit is further configured to collect the instantaneous value of the current at the first end of the power line and convert the collected instantaneous value of the current into a Fourier value of the current to acquire the first Fourier value of the current; and wherein the first transmission delay is zero.

Optionally, the current recording device provided by the embodiments of the present disclosure further comprises: a detection unit, configured to detect whether a vector sum of the aligned first current Fourier value and second current Fourier value starts to have a non-zero value from a certain time epoch, and the storage unit stores only first current Fourier values and second current Fourier values which start from the time epoch.

A current recording system is provided by the embodiments of the present disclosure, comprising a first current recording device, a second current recording device and a server. The first current recording device is configured to collect an instantaneous value of current at a first end of a power line, Fourier transform the collected instantaneous value into a first current Fourier value, and transmit the first current Fourier value to the server via a first communication channel between the first current recording device and the server; the second current recording device is configured to collect an instantaneous value of current at a second end of the power line, Fourier transform the collected instantaneous value into a second current Fourier value, and transmit the second current Fourier value to the server via a second communication channel between the second current recording device and the server; and the server is configured to time-align the first current Fourier value and the second current Fourier value based on a transmission delay for the first communication channel and a transmission delay for the second communication channel, and store the aligned first current Fourier value and second current Fourier value into a storage of the server.

Optionally, the current recording system provided by the embodiments of the present disclosure, wherein: the server is further configured to detect whether a vector sum of the aligned first current Fourier value and second current Fourier value starts to have a non-zero value from a certain time epoch, and store only first current Fourier values and second current Fourier values which start from the time epoch.

BRIEF DESCRIPTION OF DRAWINGS

These and/or other aspects, features and advantages of the present disclosure will become clearer and easier to understand from the following description of embodiments taken in conjunction with the accompanying drawings, in which.

DETAILED DESCRIPTION

Hereinafter, the present disclosure will be described in detail with reference to exemplary embodiments thereof. However, the present disclosure is not limited to the embodiments described herein, and may be implemented in many different forms. The described embodiments are only used to make the disclosure thorough and complete, and fully convey the concept of the present disclosure to the skilled in the art. The features of various embodiments described may be combined or replaced with each other unless explicitly excluded or should be excluded according to the context.

Unless otherwise defined, technical terms or scientific terms used in the present disclosure should be of the ordinary meaning understood by those ordinary skilled in the art to which the present disclosure belongs. As used in the present disclosure, "first", "second" and other similar words do not represent any order, quantity or importance, but are only used to distinguish among different components.

Figure 1:
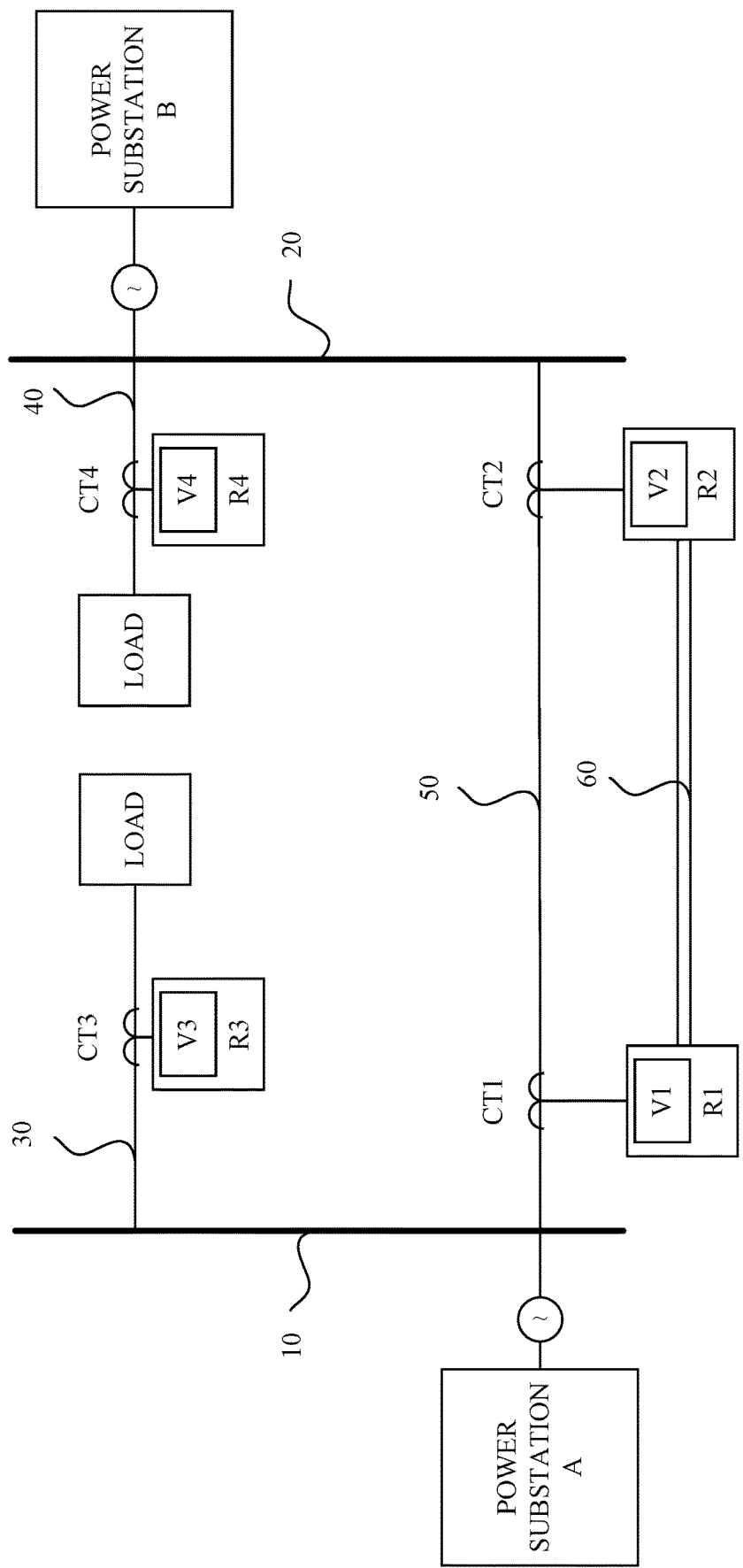
FIG. 1 is an example usage scenario diagram of a current recording method according to an embodiment of the present disclosure.

FIG. 1 is an example usage scenario diagram of a current recording method according to an embodiment of the present disclosure.

As shown in FIG. 1, a power substation A includes a bus 10 whose branches are power lines 30 and 50. A power substation B includes a bus 20 whose branches are power lines 40 and 50. The power line 30 is arranged with thereon a current transformer CT3 and a relay R3, and the power line 40 is arranged with thereon a current transformer CT4 and a relay R4. The power line 50 is arranged with a current transformer CT1 and a relay R1 associated with CT1 both at an end close to the power substation A (referred to as "A end" hereinafter), and is arranged with a current transformer CT2 and a relay R2 associated with CT2 both at an end close to the power substation B (referred to as "B end" hereinafter). Moreover, power lines 30, 40 and 50 are also arranged with circuit breakers and other power devices (not shown) associated with each relay thereon.

The current transformer CT1 measures a current value $I_1$ at the A end of the power line 50 and transmits the measured current value to the relay R1, and the current transformer CT2 measures a current value $I_2$ at the B end of the power line 50 and transmits the measured current value to the relay R2. In a similar way, the current transformers CT3 and CT4 respectively measure a current value $I_3$ at the A end of the power line 30 and a current value $I_4$ at the B end of the power line 40, and transmit the measured current values to respective relays R3 and R4. A communication channel 60 for communication between the relay R1 and the relay R2 is also arranged therebetween.

Figure 2:
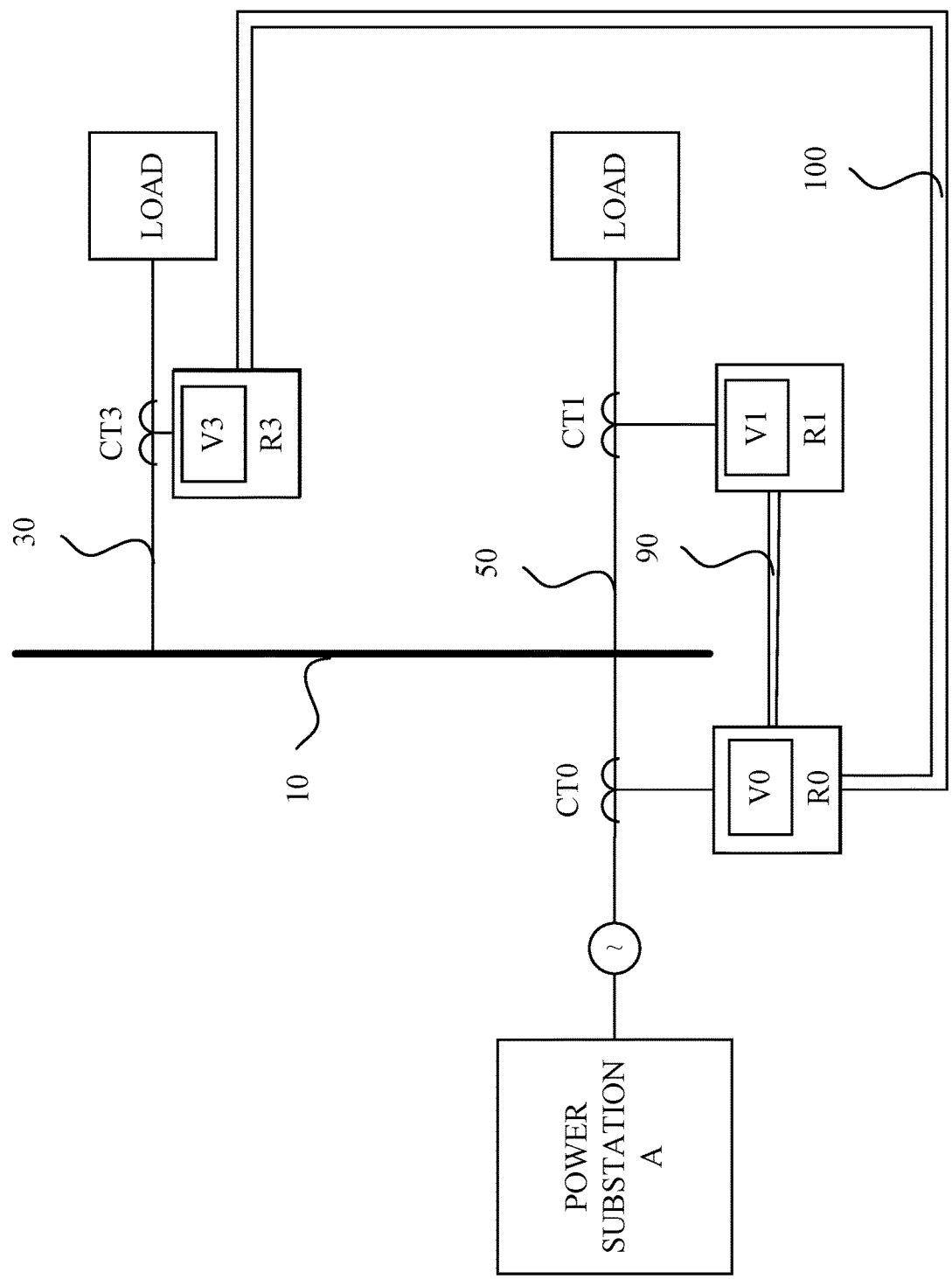
FIG. 2 is another example usage scenario diagram of s current recording method according to an embodiment of the present disclosure.

FIG. 2 is another example usage scenario diagram of a current recording method according to an embodiment of the present disclosure.

FIG. 2 is different from FIG. 1 in that the protection area for FIG. 2 is inside the power substation A instead of the power line 50 between the power substations A and B as shown in FIG. 1. As shown in FIG. 2, the bus 10 includes branches 30 and 50. The bus 10 is arranged with a current transformer CT0 and a relay R0 at the incoming end thereof. The current transformer CT0 measures a current value $I_0$ at the incoming end of the bus 10 and transmits the measured current value to the relay R0. Similar to FIG. 1, the current transformer CT1 measures the current value $I_1$ of the branch 50 and transmits the measured current value to the relay R1, and the current transformer CT3 measures the current value $I_3$ of the branch 30 and transmits the measured current value to the relay R3. A communication channel 90 for communication between the relays R0 and R1 is arranged therebetween, and a communication channel 100 for communication between the relays R0 and R3 is arranged therebetween.

Figure 3:
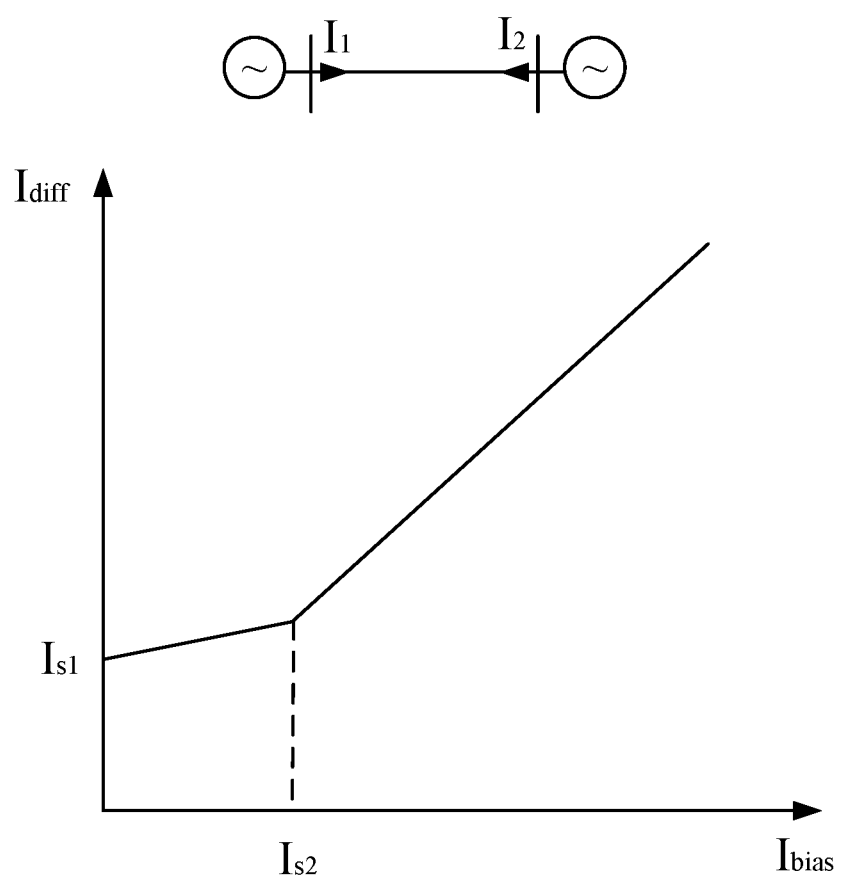
FIG. 3 is a schematic diagram of differential bias characteristics of power line.

FIG. 3 is a schematic diagram illustrating differential bias characteristics of power line.

The differential bias characteristics of power line may be used as one of the basis for triggering a differential protection action for power line (even if the circuit breaker is open), wherein the principle is to calculate a differential current of power line, that is, to calculate whether a vector sum of the incoming current for the power line and the outgoing current for the power line is zero. In the example scenario of FIG. 1, as an example, for the power line 50, the current at the A end is $I_1$ and the current at the B end is $I_2$, and the vector sum of $I_1$ and $I_2$ is zero when there is no fault on the power line 50 or there is an out-of-area fault, and is not zero when there is an in-area fault. In the example scenario of FIG. 2, for the bus 10, when there is no fault or there is an out-of-area fault, the vector sum of the current value $I_0$ at its incoming end and the current values $I_1$ and $I_3$ at the incoming ends of its two branches is zero, and when there is an in-area fault, the vector sum of the current value $I_0$ at its incoming end and the current values $I_1$ and $I_3$ at the incoming ends of its two branches is not zero.

For relay R1 in FIG. 1 as an example, it may determine whether to trigger the differential protection action of the power line 50 according to the following criteria:

For $I_{bias} < I_{s2}$, the action is triggered when $|I_{diff}| > k_1 |I_{bias}| + I_{s1}$;

For $I_{bias} > I_{s2}$, the action is triggered when $|I_{diff}| > k_2 |I_{bias}| - (k_2 - k_1) I_{s2} + I_{s1}$;

where:

$$I_{bias} = \frac{|I_1| + |I_2|}{2}$$

is the bias current of the power line 50, that is, an average value of scalar sum of the currents at both ends of the power line 50;

$I_{diff} = I_1 + I_2$ is the differential current of the power line 50, that is, a vector sum of the currents at both ends of the power line 50;

$k_1$ and $k_2$ are bias percentages; and

The values of $I_{s1}$, $I_{s2}$, $k_1$ and $k_2$ may be arbitrarily selected according to the actual situation for the power line 50. It should be noted that $I_1$ and $I_2$ here refer to the fundamental wave components of the current at the A end and the current at the B end for the power line 50, respectively.

However, the premise of using the differential bias characteristic of power line as triggering conditions for differential protection action is that the current information $I_1$ and $I_2$ at the A end and the B end are required to be time-aligned, that is, the current values of $I_1$ and $I_2$ at the same time epoch are required to temporally correspond to each other, so that the vector sum of them can reflect the power line state at this time epoch. Therefore, in a case where the power substations A and B are temporally synchronized (e.g., temporally synchronized due to the fact that both the power substations A and B are installed with GPS timing products), this characteristic can be applied as one of the triggering conditions; however, in a case where the power substations A and B are not temporally synchronized (e.g., not temporally synchronized due to the fact that at least one of the power substations A and B is not installed with any GPS timing product or a loss of GPS signal), this characteristic cannot be applied as a triggering condition as the currents $I_1$ and $I_2$ cannot be time-aligned.

In the present practice, with respect to a case where the currents $I_1$ and $I_2$ cannot be time-aligned, a typical method to handle it is to have the relay exit the differential protection and take a backup protection, that is, take a latch for the differential protection, which is considered no fault occurs. As a result, a circuit device may be damaged as a fault is not removed in time although it does occur.

In addition, in the present practice, regardless of whether the power substations A and B are temporally synchronized, that is, regardless of whether the currents $I_1$ and $I_2$ can be time-aligned, the relays only store current information from local ends, rather than that from other ends. Moreover, the current is stored in instantaneous value. For example, the relay R1 in FIG. 1 only stores the instantaneous value of the current $I_1$ from the A end of the power line, rather than the instantaneous value of the current $I_2$, which is to the disadvantage of the post-event analysis after a power line disconnection. For example, after the power line 50 is disconnected, one solution in the present practice is that an operator at one end (e.g., the A end) requests to the other end (e.g., the B end) for the current $I_2$ stored thereon. However, sometimes the current $I_2$ may have not been stored due to a failure of the internal storage of the relay R2 or the external storage associated therewith, or sometimes the current $I_2$ cannot be acquired due to the complexity and high cost of the manual request process. Both such situations make it impossible for the currents at both ends to be acquired for a post-event analysis. Also, this is to the disadvantage of storage capacity for the storage. For example, typically it is necessary to sample at least 24 points per cyclic wave to store the instantaneous value of the current $I_1$ or $I_2$. When the number of the ends within the protection area is relatively large (e.g., there are too many branches contained in the bus), the amount of data to be stored is also a challenge to the storage capacity for the storage.

In view of the above situations, the current recording method, the current recording device and the current recording system provided by the embodiments of the present disclosure can be used when there is a lack of time synchronization among relays, or there is a loss of synchronization due to an error in time management for relays or due to the loss of GPS signals, so that as long as a normal communication may be maintained among the relays, the differential protection can function continuously so as to correctly remove faults. Also, the embodiments of the present disclosure facilitate the post-event analysis after the power line disconnection by storing the current information from each end of the power line, and reduce the stored amount of data and the communicated amount of data by storing the current information in Fourier value of current.

In the scenarios of FIGS. 1 and 2, the current recording device provided by the embodiments of the present disclosure may be located inside the relays R1 to R4 and act as a part thereof, or may be located outside the relays R1 to R4 and be coupled or connected thereto, such as a current recording device V1 located inside the relay R1 and a current recording device V2 located inside the relay R2.

Figure 4:
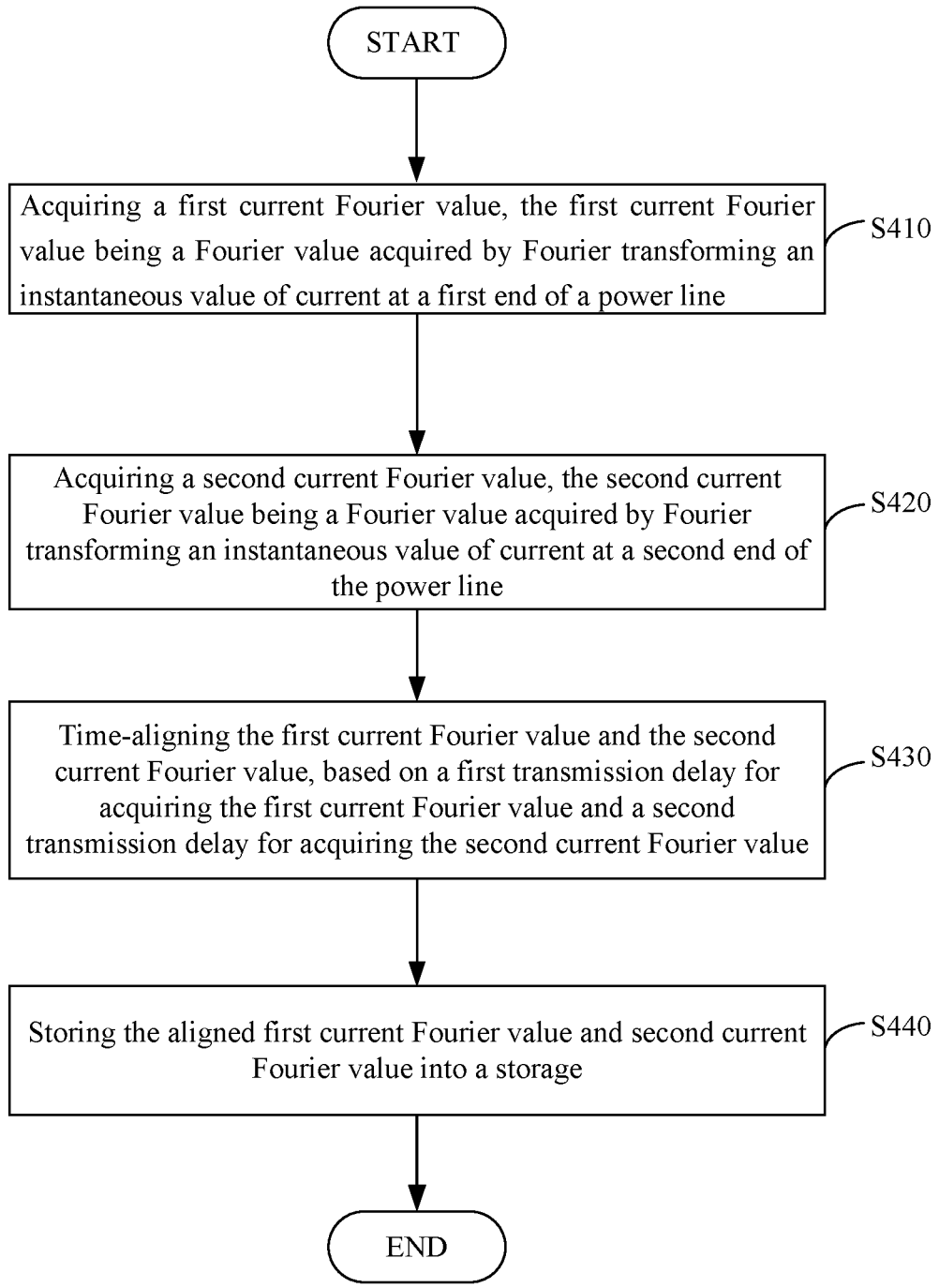
FIG. 4 is a flowchart of s current recording method according to an embodiment of the present disclosure.

FIG. 4 is a flowchart of a current recording method according to an embodiment of the present disclosure.

Referring to FIG. 4, a current recording method 400 according to an embodiment of the present disclosure may include steps S410-S440. At step S410, a first current Fourier value is acquired, which is a Fourier value acquired by Fourier transforming an instantaneous value of current at a first end of a power line. At step S420, a second current Fourier value is acquired, which is a Fourier value acquired by Fourier transforming an instantaneous value of current at a second end of the power line. At step S430, the first current Fourier value and the second current Fourier value are time-aligned, based on a first transmission delay for acquiring the first current Fourier value and a second transmission delay for acquiring the second current Fourier value. At step S440, the aligned first current Fourier value and second current Fourier value are stored into a storage.

As an embodiment, the method 400 is illustrated below with reference to FIG. 1.

Referring to FIG. 1, for the power line 50, the method 400 may be performed by the current recording device V1 at the A end of the power line 50 or the current recording device V2 at the B end of the power line 50. Either or both of the current recording devices V1 and V2 each use respective time references for current recording, and both the time references may not be synchronized.

The following takes the current recording device V1 as an example.

At step S410, the current recording device V1 collects the instantaneous value of the current $I_1$ at the A end of the power line 50, and converts the collected instantaneous value of the current $I_1$ into a Fourier value of the current $I_1$ as a first current Fourier value $F_1$. For example, the current recording device V1 receives the instantaneous value of the current $I_1$ at the A end of the power line 50 from the current transformer CT1, and converts, through Fourier transform, the instantaneous value of the current $I_1$ into the first current Fourier value $F_1$, which may be composed of an amplitude value of $I_{1A}$ and an angle value of $\varphi_{1A}$. An example of converting the instantaneous value of the current into the Fourier value of the current will be described below with reference to FIG. 9.

At step S420, the current recording device V1 acquires a second current Fourier value $F_2$ via the communication channel 60. The second current Fourier value $F_2$ is obtained by the current recording device V2, through Fourier transforming the instantaneous value of the current $I_2$ at the B end of the power line 50 received from the current transformer CT2. The second current Fourier value $F_2$ is composed of an amplitude value of $I_{2A}$ and an angle value of $\varphi_{2A}$.

Optionally, in this step, the current recording device V1 may receive the second current Fourier value $F_2$ at a predetermined time interval, for example, at every Nth($N \geq 1$) cyclic wave. For example, taking a power frequency period of 50 Hz as an example, the current recording device V1 may receive a current Fourier value for one cyclic wave from the current recording device V2 every 20 ms, that is, the current recording device V2 may transmit a current Fourier value for one cyclic wave to the current recording device V1 every 20 ms.

At step S430, the current recording device V1 time-aligns the first current Fourier value $F_1$ collected and converted by itself with the second current Fourier value $F_2$ received from the current recording device V2, that is, makes the first current Fourier value $F_1$ and the second current Fourier value $F_2$ correspond to each other as per same time epoch. In a case where there is a lack of time synchronization between the current recording device V1 and the current recording device V2, the current recording device V1 may time-align the first current Fourier value $F_1$ and the second current Fourier value $F_2$ based on a first transmission delay $Delay_{F_1}$ for acquiring the first current Fourier value $F_1$ and a second transmission delay $Delay_{F2}$ for acquiring the second current Fourier value $F_2$. Since the first current Fourier value $F_1$ is acquired by the current recording device V1 itself, so the first transmission delay $Delay_{F1}$ at this time is zero, and since the second current Fourier value $F_2$ is acquired via the communication channel 60, the second transmission delay $Delay_{F2}$ is a transmission delay $Delay_{60}$ for the communication channel 60. The specific operation of alignment may be such that, for example, when the current recording device V2 continuously transmits the second current Fourier value $F_2$ to the first current device V1, the current recording device V1 shifts forward by the transmission delay $Delay_{60}$ the reception time at which the second current Fourier value $F_2$ is received, as a time label for the second current Fourier value $F_2$.

Figure 5:
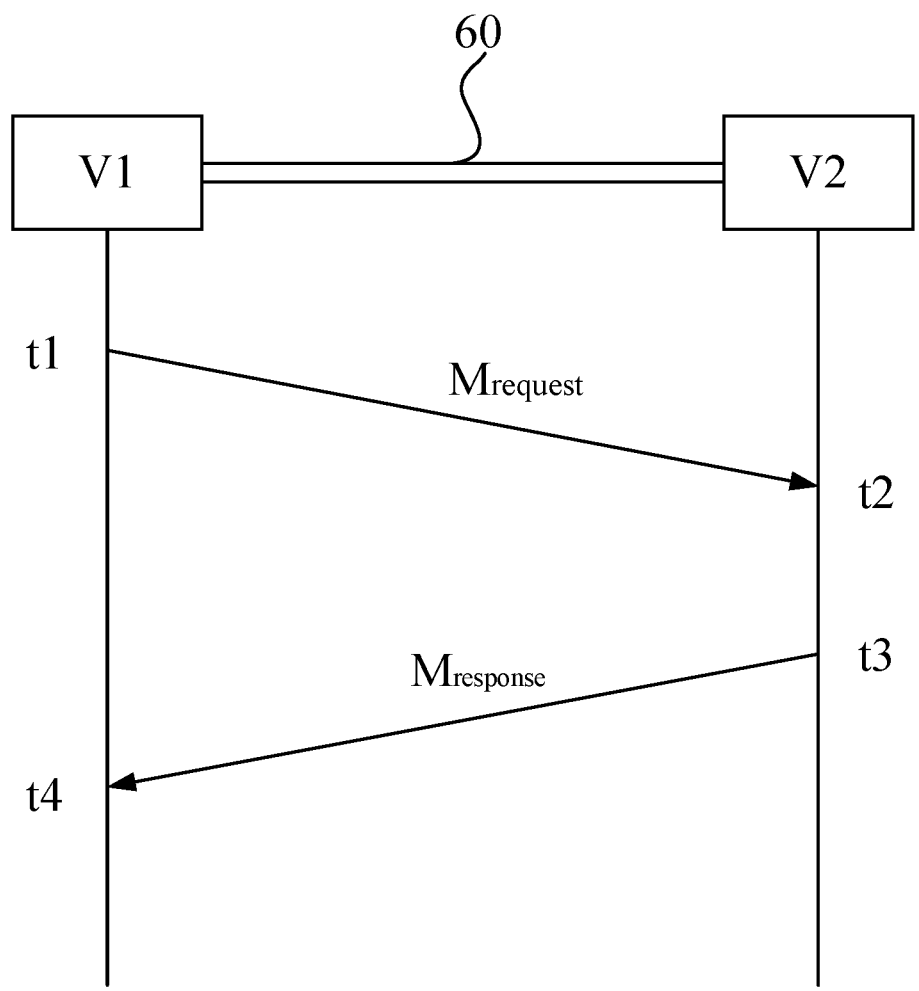
FIG. 5 is a schematic diagram of a method for determining a transmission delay according to an embodiment of the present disclosure.

In this step, the current recording device V1 may determine the transmission delay $Delay_{60}$ for the communication channel 60 based on the manner shown in FIG. 5.

FIG. 5 is a schematic diagram of a method for determining a transmission delay according to an embodiment of the present disclosure. Referring to FIG. 5, the current recording device V1 transmits a delay request signal $M_{request}$ to the current recording device V2 at time t1 and records the delay request transmission time t1. Then the current recording device V2 receives the delay request signal $M_{request}$ at time t2 and transmits a delay response signal $M_{response}$ as a response to the delay request signal to the current recording device V1 at time t3. And then the current recording device V2 includes the delay request reception time t2 and the delay response transmission time t3 in the delay response signal $M_{response}$ so as to inform the current recording device V1 of them. And then the current recording device V1 receives the delay response signal $M_{response}$ at time t4 and records the response reception time t4. Since there is a lack of time synchronization between the current recording device V1 and the current recording device V2, the times t1 and t4 are recorded with respect to the time reference of the current recording device V1, and the times t2 and t3 are recorded with respect to the time reference of the current recording device V2. Upon receiving the delay response signal $M_{response}$, the current recording device V1 would obtain time t2 and time t3, so it may calculate the transmission delay for the communication channel 60 according to Equation 1 below:

$$Delay_{60} = \frac{1}{2} \times [(t4-t1)-(t3-t2)] \quad \text{(Equation 1)}$$

In addition, the transmission delay for a communication channel may be composed of an inherent delay and a variable delay. In one aspect, the inherent delay is basically constant and its size depends on the transmission rate of signal and the length of interconnected conductor, and in turn the transmission rate of signal is related to the dielectric constant of insulating material and the electrical properties of transmission conductor. In another aspect, the variable delay may be affected by the processing speed of switches, the crosstalk of adjacent signal lines and environmental factors. Therefore, the transmission delay for the communication channel varies over time. As such, in an embodiment, the above process for determining a transmission delay is performed continuously and repeatedly or performed at a predetermined time interval. For example, the current recording device V1 may transmit the first current Fourier value $F_1$ to the current recording device V2 while transmitting the delay request signal $M_{request}$, and the current recording device V2 may transmit the second current Fourier value $F_2$ to the current recording device $V_1$ while transmitting the delay response signal $M_{response}$. When the current recording device V1 performs an alignment operation, the first current Fourier value $F_1$ and the second current Fourier value $F_2$ are aligned based on the latest determined transmission delay.

At step S440, the current recording device V1 stores the aligned first current Fourier value $F_1$ and second current Fourier value $F_2$ into its storage.

It should be understood that the current recording method described above with respect to the current recording device V1 is also applicable to the current recording device V2 or other current recording devices of other power lines.

It should be understood that the method for determining the transmission delay for the communication channel 60 shown in FIG. 5 described above with respect to the current recording device V1 is also applicable to the current recording device V2 or other current recording devices of other power lines.

Therefore, the embodiments of the present disclosure time-align the current information from one end of the power line and the current information from the other end of the power line based on the transmission delay for the communication channel, and even if there is a lack of time synchronization between these two ends, as long as a normal communication may be maintained between the current recording devices at both ends, the differential protection can function continuously so as to correctly remove faults.

Therefore, when the current recording device V1 and the current recording device V2 perform the current recording method 400 at the same time, the current Fourier values generated thereby are communicated between the two ends. As such, even if the current Fourier values of one of the two ends cannot be stored due to a failure of the storage module or other reasons, they may be stored at the other end. This is beneficial to the post-event analysis after a power line disconnection. Meanwhile, by storing the current Fourier values of both ends in the current recording devices at both ends, an operator at either end can conveniently and quickly acquire the current Fourier values of both ends without requesting the other end to communicate its current Fourier values through a complicated manual process.

As another embodiment, the method 400 will be described with reference to FIG. 6.

Figure 6:
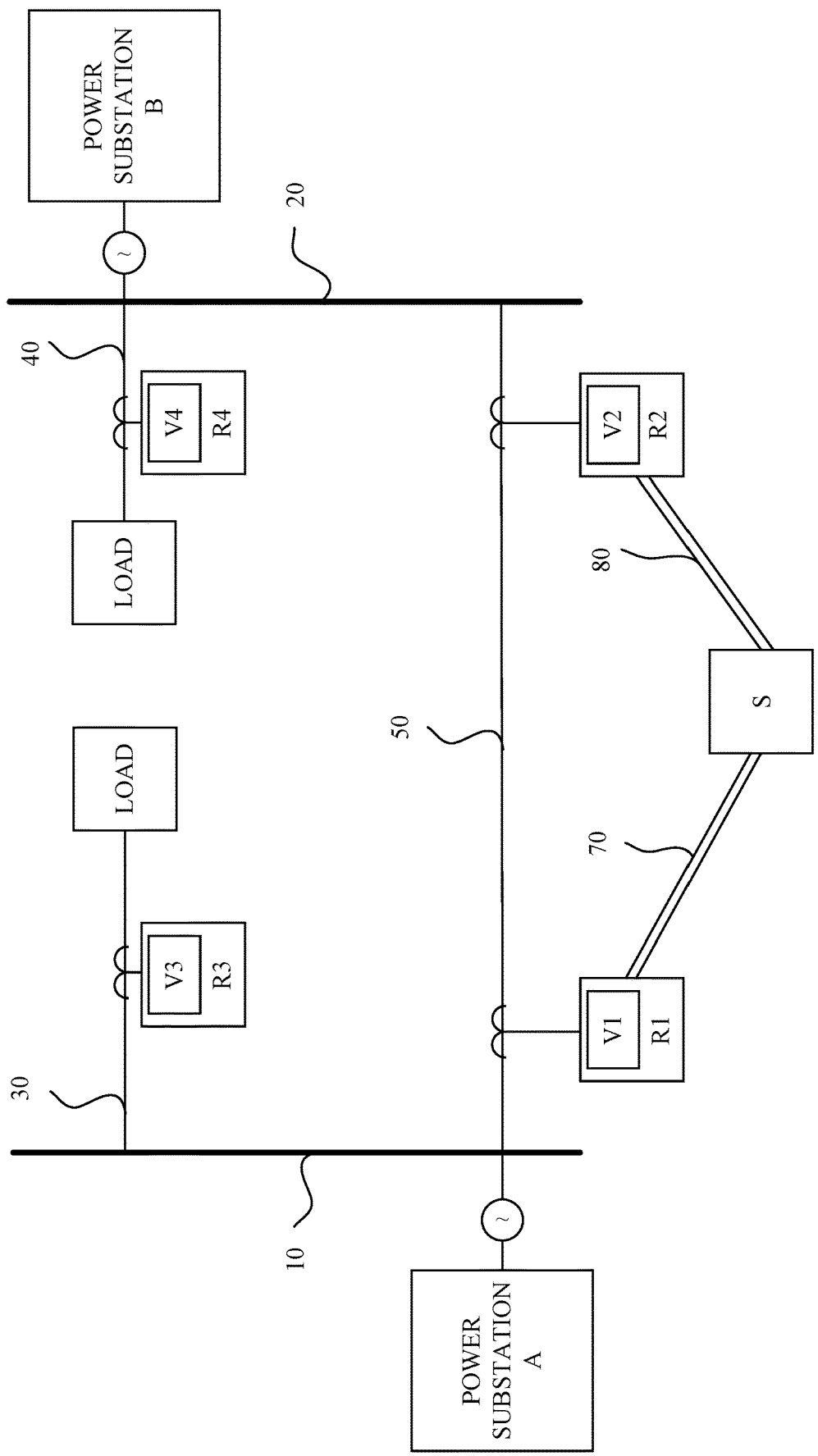
FIG. 6 is an example usage scenario diagram of a current recording method according to another embodiment of the present disclosure.

FIG. 6 is a usage scenario diagram of a current recording method according to another embodiment of the present disclosure.

Referring to FIG. 6, FIG. 6 is different from FIG. 1 in that the current recording device V1 and the current recording device V2 are connected to a server S through a communication channel 70 and a communication channel 80, respectively. The server S may be any computer, workstation, cloud server, etc. with capacity for computing and processing. In this embodiment, the current recording method 400 may be performed by a server. The current recording device V1 and the current recording device V2 may perform current recording using their respective time references without performing time synchronization.

At step S410, the server S acquires the first current Fourier value $F_1$ from the first current recording device V1 via its first communication channel 70 with the first current recording device V1, which is used to collect the instantaneous value of the current $I_1$ at the A end of the power line 50 and convert the collected instantaneous value of the current $I_1$ into the first current Fourier value $F_1$.

At step S420, the server S acquires the second current Fourier value $F_2$ from the second current recording device V2 via its second communication channel 80 with the second current recording device V2, which is used to collect the instantaneous value of the current $I_2$ at the B end of the power line 50 and convert the collected instantaneous value of the current $I_2$ into the second current Fourier value $F_2$.

Similar to the above description in conjunction with FIG. 1, in step S410 and step S420, the first current Fourier value $F_1$ and the second current Fourier value $F_2$ may be received at a predetermined time interval, which will not be described in detail here.

At step S430, the server S time-aligns the first current Fourier value $F_1$ and the second current Fourier value $F_2$. In a case where the current recording device V1 and the current recording device V2 are not temporally synchronized, the server S may align the first current Fourier value $F_1$ and the second current Fourier value $F_2$ based on the first transmission delay $Delay_{F1}$ for the first current Fourier value $F_1$ and the second transmission delay $Delay_{F2}$ for the second current Fourier value $F_2$. Since the first current Fourier value $F_1$ is acquired via the communication channel 70, the first transmission delay $Delay_{F1}$ at this time is a transmission delay $Delay_{70}$ for the communication channel 70, and since the second current Fourier value $F_2$ is acquired via the communication channel 80, the second transmission delay $Delay_{F2}$ is a transmission delay $Delay_{80}$ for the communication channel 80. The specific operation of alignment may be such that, for example, when the current recording device V1 and the current recording device V2 continuously transmits the first current Fourier value $F_1$ and the second current Fourier value $F_2$ to the server S, the current recording device V1 shifts forward by the transmission delay $Delay_{70}$ the reception time at which the first current Fourier value $F_1$ is received, as a time label for the first current Fourier value $F_1$, and shifts forward by the transmission delay $Delay_{80}$ the reception time at which the second current Fourier value $F_2$ is received, as a time label for the second current Fourier value $F_2$.

In this step, the server S may also determine the first transmission delay for the communication channel 70 or the second transmission delay for the communication channel 80 in the manner shown in FIG. 5. For example, the server S transmits a delay request signal $M_{request}'$ to the current recording device V1 at time t1' and records the delay request transmission time t1'. Then the current recording device V1 receives the delay request signal $M_{request}'$ at time t2' and transmits a delay response signal $M_{response}'$ as a response to the delay request signal to the server S at time t3'. And then the current recording device V1 includes the delay request reception time t2' and the delay response transmission time t3' in the delay response signal $M_{response}'$ so as to inform the server S of them. And then the server S receives the delay response signal $M_{response}'$ at time t4' and records the response reception time t4'. The server S calculates the transmission delay for the communication channel 70 according to Equation 2 below:

$$Delay_{70}=\tfrac{1}{2}\times[(t4'-t1')-(t3'-t2')] \quad \text{(Equation 2)}$$

In a similar way, the server S transmits a delay request signal $M_{request}''$ to the current recording device V2 at time t1'' and records the delay request transmission time t1''. Then the current recording device V2 receives the delay request signal $M_{request}''$ at time t2'' and transmits a delay response signal $M_{response}''$ as a response to the delay request signal to the server S at time t3''. And then the current recording device V2 includes the delay request reception time t2'' and the delay response transmission time t3'' in the delay response signal $M_{response}''$ so as to inform the server S of them. And then the server S receives the delay response signal $M_{response}''$ at time t4'' and records the response reception time t4''. The server S calculates the transmission delay for the communication channel 80 according to Equation 3 below:

$$Delay_{80}=\tfrac{1}{2}\times[(t4''-t1'')-(t3''-t2'')] \quad \text{(Equation 3)}$$

Similar to the above described in conjunction with FIG. 1, since the transmission delay for the communication channel varies over time, the process for determining the transmission delay $Delay_{70}$ or $Delay_{80}$ is performed continuously and repeatedly or performed at a predetermined time interval, and when performing time alignment, the server S uses the latest determined transmission delay $Delay_{70}$ or $Delay_{80}$ for alignment.

At step S440, the server S stores the aligned first current Fourier value $F_1$ and second current Fourier value $F_2$ into its storage. In this step, the server S may also transmit the aligned first current Fourier value $F_1$ and second current Fourier value $F_2$ to the current recording device V1 and the current recording device V2 for storage in their respective storages.

Therefore, since the server possesses a strong capacity for computation and storage, and is generally located in a control room with a relatively good environment (e.g., the cloud server may be located in a computing center with better protection measures) rather than located in a harsh wild environment as a power substation, the current information can be aligned more quickly and stored more safely and effectively through the server.

It should be understood that an implementation based on FIG. 6 and an implementation based on FIG. 1 may be combined, that is, the current Fourier values are stored in both a server and a current recording device.

In addition, in order to avoid storing too many unnecessary current Fourier values and thus lead to an occupancy for a large amount of storage space, only the current Fourier values closely related to the differential protection action can be stored appropriately and selectively, which will be illustrated with reference to FIG. 7.

Figure 7:
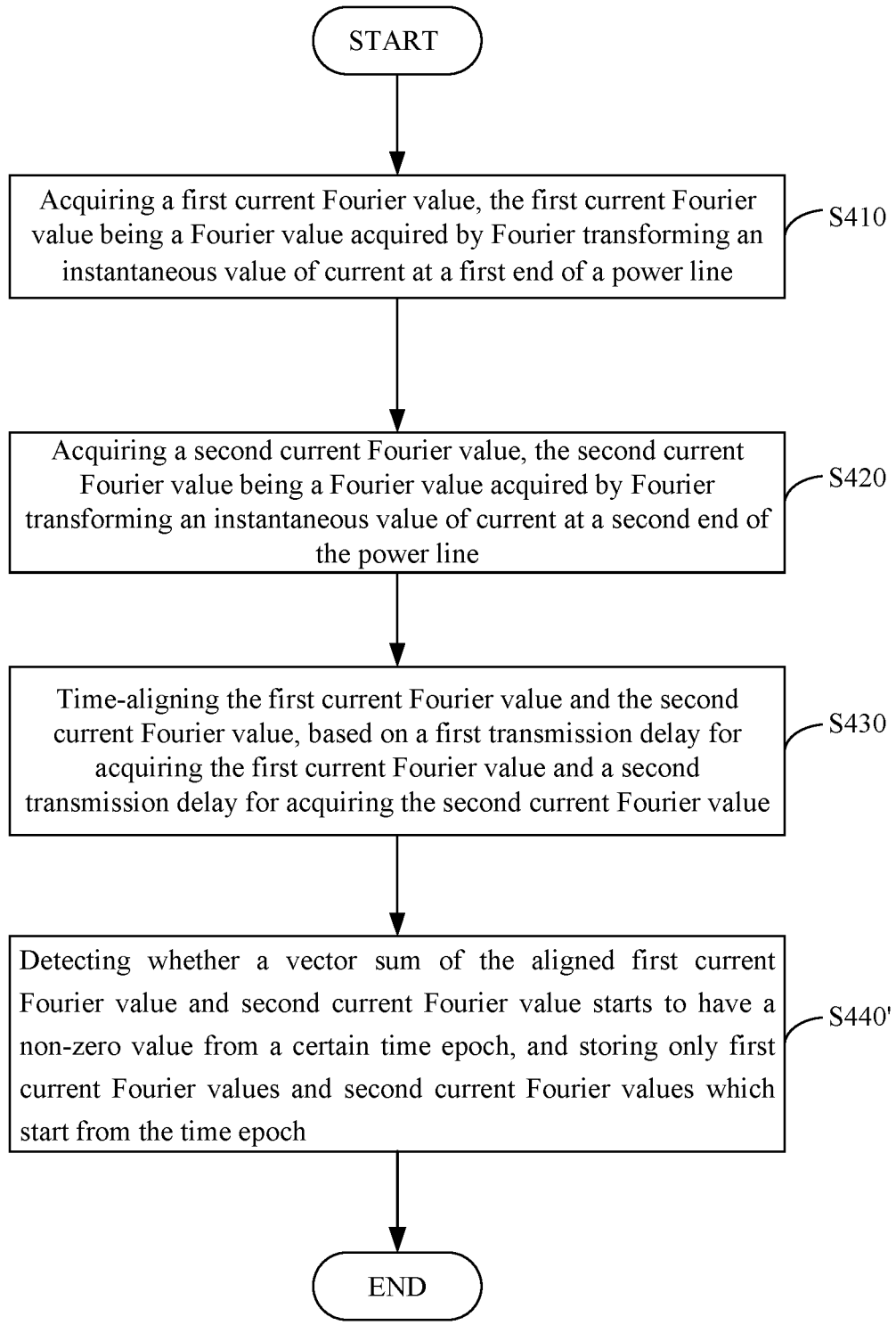
FIG. 7 is a flowchart of another current recording method according to an embodiment of the present disclosure.

FIG. 7 is a flowchart of another current recording method according to an embodiment of the present disclosure.

As shown in FIG. 7, steps S410 to S430 in another current recording method 400' are the same as steps S410 to S430 in the method 400, except that in step S440', it is detected whether a vector sum of the aligned first current Fourier value $F_1$ and second current Fourier value $F_2$ starts to have a non-zero value from a certain time epoch, and only first current Fourier values $F_1$ and second current Fourier values $F_2$ which start from the time epoch are stored. The reason for doing so is that, according to the basic principle of differential protection for power lines as described above, when there is no fault on the power line or there is an out-of-area fault, the vector sum of the incoming current for the power line and the outgoing current for the power line is zero, while once there is an in-area fault on the power line at a certain time epoch, the vector sum of the incoming current for the power line and the outgoing current for the power line is not zero. This means that a first current Fourier value $F_1$ and a second current Fourier value $F_2$ whose stored vector sum of amplitudes is zero (before an in-area fault occurs) are of little significance for the post-event analysis after a power line disconnection. Therefore, only first current Fourier values $F_1$ and second current Fourier values $F_2$ which starting from a time epoch at which the vector sum of the first current Fourier value $F_1$ and the second current Fourier value $F_2$ becomes non-zero can be selectively stored, until the current becomes zero due to a power line disconnection resulting from a differential protection action, thereby saving the storage space.

In addition, in some embodiments, since the current information for a short period of time before occurrence of an in-area fault is helpful for fault analysis, the following storage method may also be adopted: detecting whether a vector sum of the aligned first current Fourier value $F_1$ and second current Fourier value $F_2$ starts to have a non-zero value from a certain time epoch, and storing first current Fourier values $F_1$ and second current Fourier values $F_2$ corresponding to K (K is an integer greater than or equal to zero) cyclic waves before the time epoch. The value of K is determined depending on the actual situation and may be set or changed by the user. For instance, taking a power frequency of 50 Hz (i.e., a cyclic wave of 20 ms) and K=2 as an example, it may be set that only the current information for the latest 10 cyclic waves (i.e., the aligned first current Fourier values $F_1$ and second current Fourier values $F_2$) is stored by default. When it is detected that the vector sum of the first current Fourier value $F_1$ and the second current Fourier value $F_2$ starts to have a non-zero value from time epoch T, first current Fourier values $F_1$ and second current Fourier values $F_2$ which start from T-40 ms (K=2) may be stored, until the current becomes zero due to a power line disconnection resulting from a differential protection action, thereby saving the storage space. This embodiment may be realized, for example, by buffering current Fourier values for a predetermined time (e.g., a time corresponding to K cyclic waves) at any time, and when a time epoch at which the vector sum becomes non-zero occurs, the previously buffered current Fourier values are stored as the current Fourier value before that time epoch.

The current recording method for a power line protection area including two ends has been described above in conjunction with FIG. 1 and FIGS. 4 to 7, and this method is also applicable to a protection area including three or more ends. The following is illustrated with reference to FIG. 3 and FIG. 8.

Figure 8:
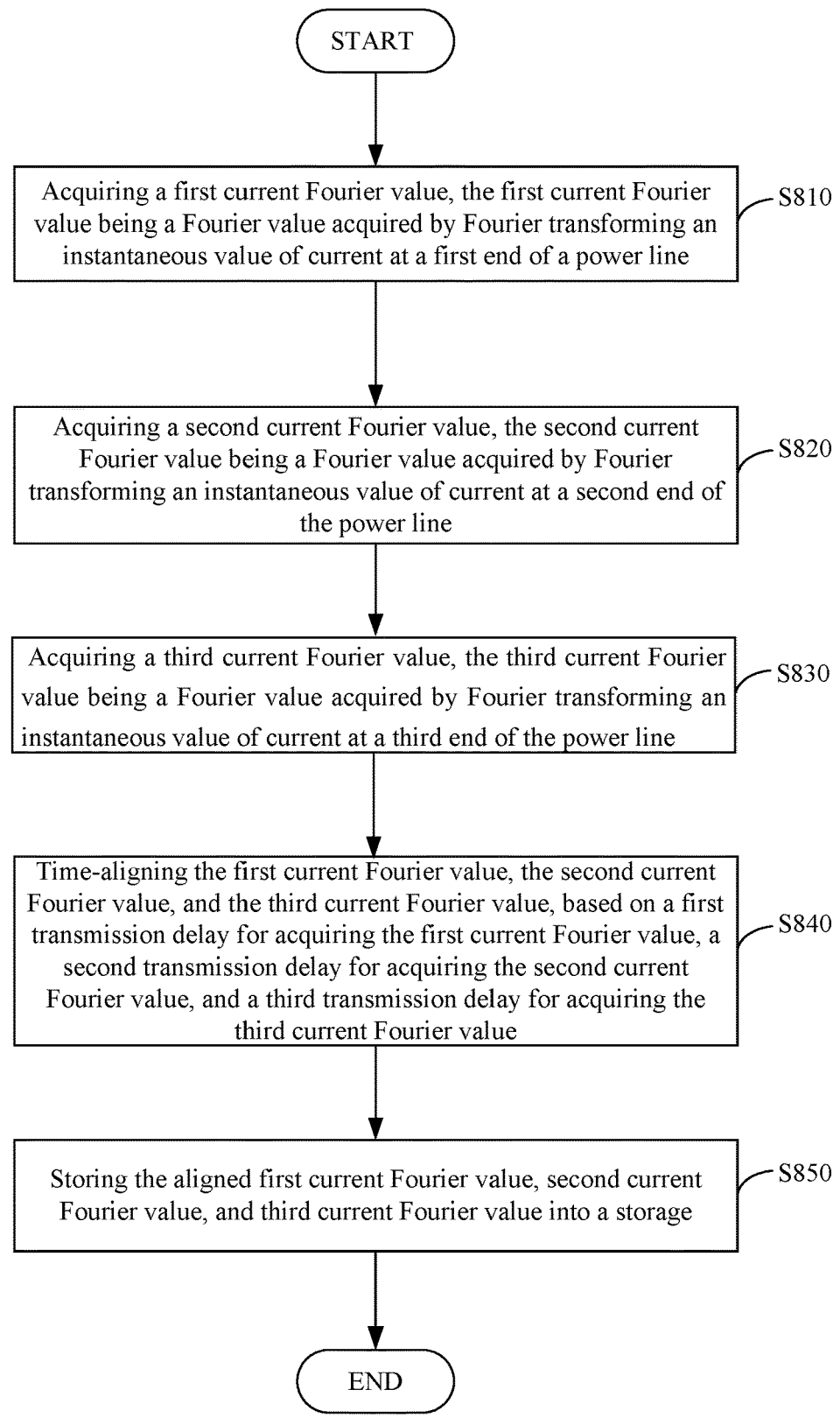
FIG. 8 is a flowchart of another current recording method according to an embodiment of the present disclosure.

FIG. 8 is a flowchart of another current recording method according to an embodiment of the present disclosure.

Referring to FIG. 2 again, the bus 10 includes branches 30 and 50. The bus 10 is arranged with the current transformer CT0 and the relay R0 at the incoming end thereof. The current transformer CT0 measures the current value $I_0$ at the incoming end of the bus 10 and transmits the measured current value to the relay R0. The current transformer CT1 measures the current value $I_1$ of the branch 50 and transmits the measured current value to the relay R1. The current transformer CT3 measures the current value $I_3$ of the branch 30 and transmits the measured current value to the relay R3.

As an example, the current recording device according to the embodiments of the present disclosure may be, for example, a current recording device V0, V1 or V3 inside a relay R0, R1 or R3, respectively.

Take the current recording method 800 performed by the current recording device V0 as an example.

At step S810, the current recording device V0 collects the instantaneous value $I_0$ of the current at the incoming end of the bus 10, and converts the collected instantaneous value $I_0$ of the current into a Fourier value of the current as a first current Fourier value $F_0$.

At step S820, the current recording device V0 acquires a second current Fourier value $F_1$ via the communication channel 90. The second current Fourier value $F_1$ is obtained by Fourier transforming the instantaneous value $I_1$ of the current of the branch 50 received from the current transformer CT1 by the current recording device V1.

At step S830, the current recording device V0 acquires a third current Fourier value $F_3$ via the communication channel 100. The third current Fourier value $F_3$ is obtained by Fourier transforming the instantaneous value $I_3$ of the current of the branch 30 received from the current transformer CT3 by the current recording device V3.

At step S840, the current recording device V0 may time-align the first current Fourier value $F_0$, the second current Fourier value $F_1$, and the third current Fourier value $F_3$, based on the first transmission delay for the first current Fourier value $F_0$, the second transmission delay for the second current Fourier value $F_1$, and the third transmission delay for the third current Fourier value $F_3$, wherein the first transmission delay $Delay_{F0}$ is zero, the second transmission delay $Delay_{F1}$ is a transmission delay $Delay_{90}$ for the communication channel 90, and the third transmission delay $Delay_{F3}$ is a transmission delay $Delay_{100}$ for the communication channel 100. The method for determining the transmission delays $Delay_{90}$ and $Delay_{100}$ is the same as the method for determining the transmission delay described above with reference to FIG. 5, and will not be described in detail here.

At step S850, the current recording device V0 stores the aligned first current Fourier value $F_0$, second current Fourier value $F_1$ and third current Fourier value $F_3$ into its storage.

In addition, similar to step S440' previously described with reference to FIG. 7, the current recording device V0 may also optionally detect whether the vector sum of the aligned first current Fourier value $F_0$, second current Fourier value $F_1$ and third current Fourier value $F_3$ starts to have a non-zero value from a certain time epoch, and only store first current Fourier values $F_0$, second current Fourier values $F_1$ and third current Fourier values $F_3$ which start from the time epoch, which will not be described in detail here.

In addition, the current recording device V0 may also optionally store first current Fourier values $F_0$, second current Fourier values $F_1$ and third current Fourier values $F_3$ corresponding to K (K is an integer greater than or equal to zero) cyclic waves before the said time epoch, which will not be described in detail here.

In addition, it is easily understood for the skilled in the art that the example of performing the current recording method by the server S previously described in conjunction with FIG. 6 is also applicable to the scenario of FIG. 2, that is, the steps for acquiring, time-aligning and storing the first current Fourier value $F_0$, the second current Fourier value $F_0$ and the third current Fourier value $F_3$ may also be performed by a server communicatively connected with the current recording devices V0, V1 and V3, which will not be described in detail here.

Figure 9:
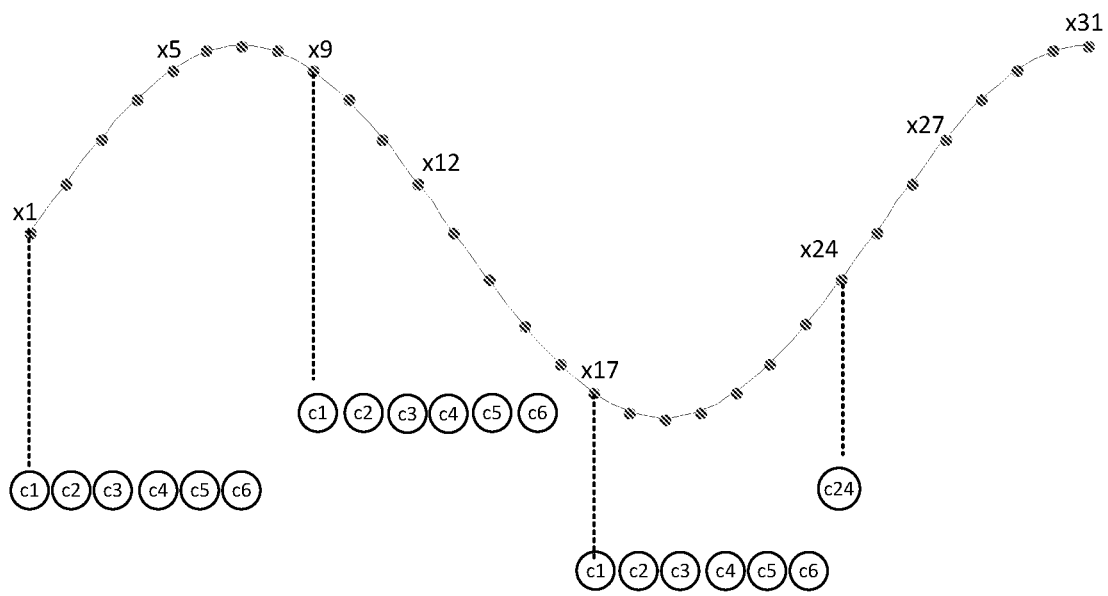
FIG. 9 is a schematic diagram of Fourier transform for current instantaneous values according to an embodiment of the present disclosure.

FIG. 9 is a schematic diagram of Fourier transform for current instantaneous values according to an embodiment of the present disclosure.

Fourier transform may be used to calculate fundamental or harmonic components from real-time sampled signals. A real-time sampled signal may be regarded as a superposition of a plurality of components, which may be expressed by Equation 4 below:

$$x(w) \approx a_0 + \sum_{n=0}^{N-1}[a_k\cos(n*k*w_0) + b_k\sin(n*k*w_0)] \quad \text{(Equation 4)}$$

where: N is the number of sampling points per cyclic wave, and (n=0, 1, 2 . . . , N−1); w is the real-time angular frequency; $w_0$ is the fundamental angular frequency, e.g., which is 2π*50 rad/sec for a system with a power frequency period of 50 Hz. The fundamental component may be calculated when k=1, the second harmonic component may be calculated when k=2, and so on.

x(w) is converted into X(k) by Fourier transformation, which may be expressed by Equation 5 below:

$$X(k) = a_k + jb_k \quad \text{(Equation 5)}$$

For a periodic signal, its real part and imaginary part may be calculated according to Equation 6 and Equation 7 below:

$$a_k = \frac{2}{N} \sum_{n=0}^{N-1} \left[ x(n) * \cos\left(\frac{2\pi}{N} n * k\right) \right] \quad \text{(Equation 6)}$$

$$b_k \approx -\frac{2}{N} \sum_{n=0}^{N-1} \left[ x(n) * \sin\left(\frac{2\pi}{N} n * k\right) \right] \quad \text{(Equation 7)}$$

The cosine coefficient $$\cos\left(\frac{2\pi}{N} n * k\right)$$

in Equation 6 and the sine coefficient $$\sin\left(\frac{2\pi}{N} n * k\right)$$

in Equation 7 are referred to as a real part coefficient and an imaginary part coefficient for a Fourier value, respectively, and they are related to the number of sampling points N per cyclic wave.

Take the current recording device V1 converting the instantaneous value of the current $I_1$ into the first Fourier value $F_1$ as an example.

FIG. 9 illustrates an example of the instantaneous values of the current $I_1$, where x1, x2 . . . xn are the instantaneous values of the current $I_1$. Fourier transform may be performed in units of instantaneous values for one or more cyclic waves, for example, in units of one cyclic wave. Assuming that 24 points are sampled per cyclic wave, then x1~x24 correspond to the instantaneous values for one cycle. The sine coefficients corresponding to x1, x2 . . . x24 are denoted as c1, c2 . . . c24, and the cosine coefficients corresponding to x1, x2 . . . x24 are denoted as s1, s2 . . . s24. Firstly, Fourier transform is performed for the first time, and a Fourier value corresponding to the instantaneous values x1~x24 are calculated:

the real part $$A1 = \frac{2}{N}(x1*c1 + x2*c2 + \ldots + x24*c24)$$

and the imaginary part $$B1 = -\frac{2}{N}(x1*s1 + x2*s2 + \ldots + x24*s24)$$

are calculated according to Equation 6 and Equation 7, and then, for the Fourier value, the amplitude is obtained as $I_{1A1} = \sqrt{(A1)^2 + (B1)^2}$, and the angle is obtained as $$\varphi_{1A1} = \arctan\left(\frac{B1}{A1}\right) \times \frac{180}{\pi}.$$

That is to say, through the above calculation, the current represented by the instantaneous values of x1~x24 may be denoted as the amplitude $I_{1A1}$ and the angle $\varphi_{1A1}$ alternatively.

The instantaneous current values x1~x24 for one cyclic wave varies over time as x2~x25, x3~x26, x24~x27 . . . . As long as the Fourier values corresponding to x2~x25, x3 x26, x24~x27, etc. are calculated, these time-varying instantaneous current values may be replaced by these time-varying Fourier values. However, the inventor of the present disclosure has found that it is not necessary to perform Fourier value conversion once per sampling point, and instead, the Fourier value conversion may be performed once every L (L is an integer greater than 2) sampling points. In this way, the obtained time-varying Fourier values are sufficient to reflect a trend for current variation over time, and is also sufficient for post-event analysis after a power line disconnection. In other words, the number of Fourier transforms may be less than the number of sampling points for the instantaneous values of the current. The value of L may be selected according to the performance of the relays and the time at which the fault is removed. In an embodiment of the present disclosure, it may be taken that L=8.

Similarly, for the second time, a Fourier value corresponding to the instantaneous values x9~x32 are calculated:

the real part $$A2 = \frac{2}{N}(x9*c1 + x10*c2 + \ldots + x32*c24)$$

and the imaginary part $$B2 = -\frac{2}{N}(x9*s1 + x10*s2 + \ldots + x32*s24)$$

are calculated according to Equation 6 and Equation 7, and then, for the Fourier value, the amplitude is obtained as $I_{1A2} = \sqrt{(A2)^2 + (B2)^2}$, and the angle is obtained as $$\varphi_{1A2} = \arctan\left(\frac{B2}{A2}\right) \times \frac{180}{\pi}.$$

Similarly, for the third time, a Fourier value corresponding to the instantaneous values x17~x40 are calculated:

the real part $$A3 = \frac{2}{N}(x17*c1 + x18*c2 + \ldots + x40*c24)$$

and the imaginary part $$B3 = -\frac{2}{N}(x17*s1 + x18*s2 + \ldots + x40*s24)$$

are calculated according to Equation 6 and Equation 7, and then, for the Fourier value, the amplitude is obtained as $I_{1A3} = \sqrt{(A3)^2 + (B3)^2}$, and the angle is obtained as $$\varphi_{1A3} = \arctan\left(\frac{B2}{A2}\right) \times \frac{180}{\pi}.$$

In a similar way, the Fourier value $F_1$ of the time-varying current may be calculated.

Through Fourier transform, compared with 24 instantaneous values required to be stored for the current information for one cyclic wave, in the case of L=8 according to an embodiment of the present disclosure, only 6 values are required to be stored, including 3 amplitude values and 3 angle values, which greatly reduces the amount of data to be stored. Also, the embodiment of the present disclosure may lower the requirement on an optical fiber module of the current recording device by storing Fourier values of the current instead of instantaneous values of the current, thus saving cost. Note that the cost of the optical fiber module of the current recording device accounts for a large part of the manufacturing cost of the current recording device, sometimes up to 70%.

Figure 10:
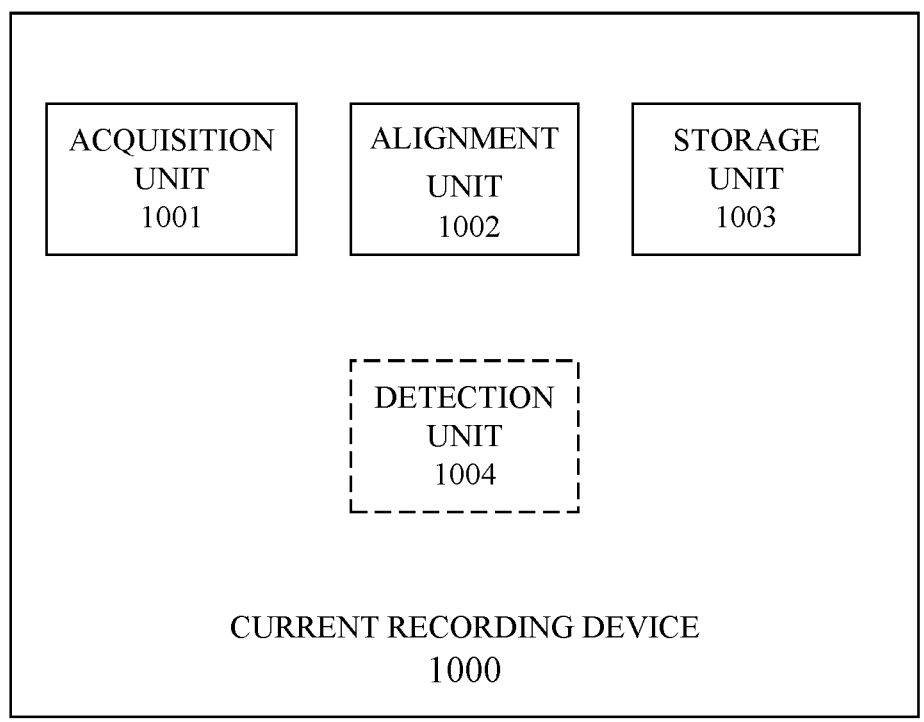
FIG. 10 is a block diagram of a current record device according to an embodiment of that present disclosure.

FIG. 10 is a block diagram of a current record device according to an embodiment of the present disclosure.

As shown in FIG. 10, a current recording device 1000 (e.g., the respective current recording devices V1 to V4 in FIGS. 1 and 2 and the server S in FIG. 6) may include an acquisition unit 1001, an alignment unit 1002 and a storage unit 1003. The acquisition unit 1001 is configured to acquire a first current Fourier value and a second current Fourier value, wherein the first current Fourier value is a Fourier value acquired by Fourier transforming an instantaneous value of current at a first end of a power line (e.g., the power line 50 in FIGS. 1, 3 and 6), and the second current Fourier value is a Fourier value acquired by Fourier transforming an instantaneous value of current at a second end of the power line. The align unit 1002 is configured to time-align the first current Fourier value and the second current Fourier value base on a first transmission delay for receiving the first current Fourier value and a second transmission delay for receiving the second current Fourier value. The storage unit 1003 is configured to store the aligned first current Fourier value and second current Fourier value.

In addition, optionally, the current recording device 1000 (e.g., the respective current recording devices in FIGS. 1 and 3 and the server S in FIG. 6) may further include a detection unit 1004, which is configured to detect whether a vector sum of the aligned first current Fourier value and second current Fourier value starts to have a non-zero value from a certain time epoch. In this case, the storage unit 1003 stores only first current Fourier values and second current Fourier values which start from the time epoch.

Figure 11:
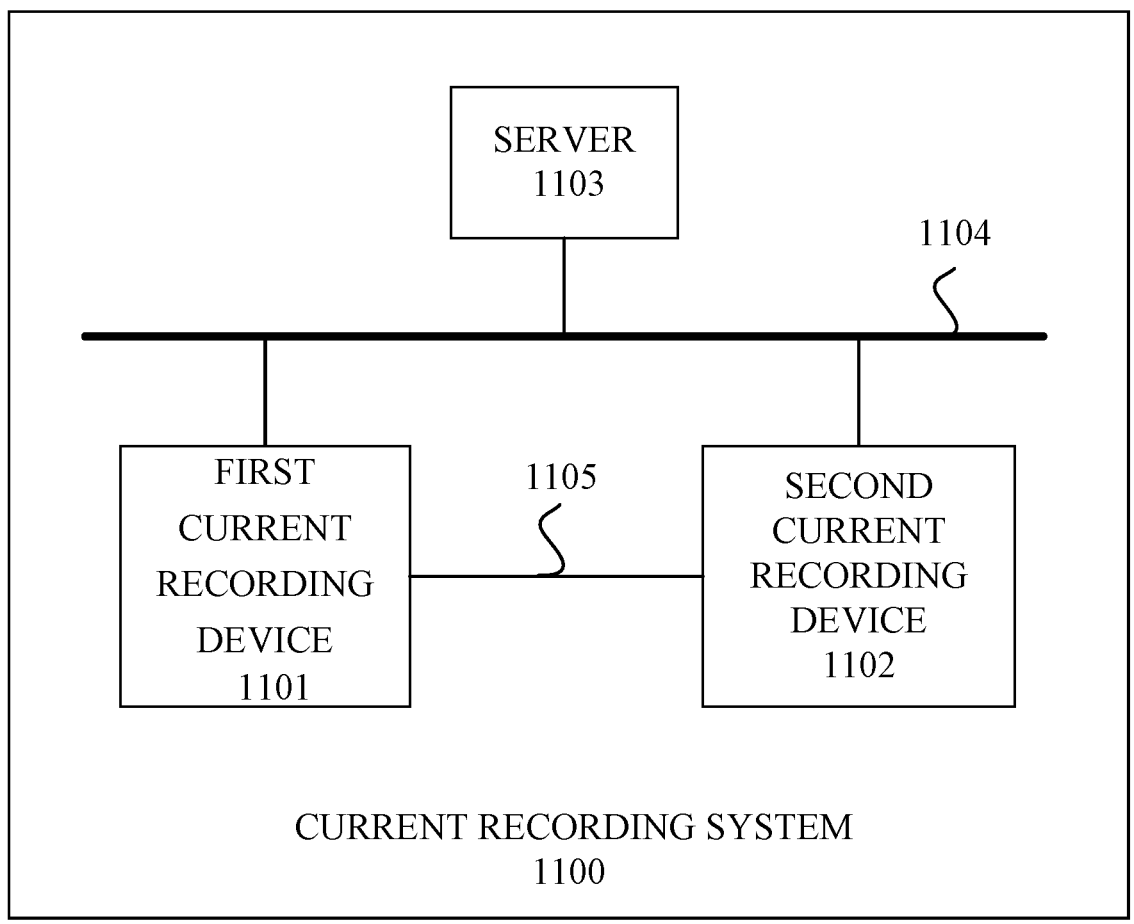
FIG. 11 is a block diagram of a current record system according to an embodiment of that present disclosure.

FIG. 11 is a block diagram of a current record system according to an embodiment of the present disclosure.

As shown in FIG. 11, a current recording system 1100 includes a first current recording device 1101, a second current recording device 1102, and a server 1103 (e.g., the current recording device V1, the current recording device V2, and the server S in FIG. 6). The first current recording device 1101, the second current recording device 1102 and the server 1103 communicate with each other via a communication channel 1104 (e.g., the communication channels 70 and 80 in FIG. 6), and the first current recording device 1101 and the second current recording device 1102 are connected via a power line 1105 (e.g., the power line 50 in FIG. 6).

The first current recording device 1101 is configured to collect an instantaneous value of current at a first end of the power line 1105, Fourier transform the collected instantaneous value into a first current Fourier value, and transmit the first current Fourier value to the server 1103 via a communication channel (e.g., the communication channel 70 or 80 in FIG. 6).

The second current recording device 1102 is configured to collect an instantaneous value of current at a second end of the power line 1105, Fourier transform the collected instantaneous value into a second current Fourier value, and transmit the second current Fourier value to the server 1103 via a second communication channel (e.g., the communication channel 80 or 70 in FIG. 6).

The server 1103 time-aligns the first current Fourier value and the second current Fourier value based on a first transmission delay for the first current Fourier value and a second transmission delay for the second current Fourier value, and stores the aligned first current Fourier value and second current Fourier value in at least a storage of the server 1103.

The current recording method, the current recording device and the current recording system according to the embodiments of the present disclosure may be employed without time synchronization at several ends or all ends of the power line. The storage space and cost for communication transmission can be saved by storing Fourier values of current instead of instantaneous values of current. By transmitting the Fourier values of the current to each end of the power line and storing them at each end, it is possible to avoid being unable to perform the post-event analysis for the differential protection action due to a failure for storing the current information at one end or several ends, and at the same time it is also possible to acquire all the current information on the post-event analysis for the differential protection action conveniently and quickly.

It should be understood by those skilled in the art that the above specific embodiments are only exemplary and not restrictive, and various modifications, combinations, partial combinations and substitutions can be made to the embodiments of the present disclosure according to design requirements and other factors, as long as they fall within the scope of the appended claims or their equivalents, that is, belong to the scope of the rights required to be protected by this disclosure.

What is claimed is:

1. A current recording method, comprising:
    acquiring a first current Fourier value, the first current Fourier value being a Fourier value acquired by Fourier transforming an instantaneous value of current at a first end of a power line;
    acquiring a second current Fourier value, the second current Fourier value being a Fourier value acquired by Fourier transforming an instantaneous value of current at a second end of the power line;
    time-aligning the first current Fourier value and the second current Fourier value, based on a first transmission delay for acquiring the first current Fourier value and a second transmission delay for acquiring the second current Fourier value; and storing the aligned first current Fourier value and second current Fourier value into a storage, wherein the first current Fourier value and the second current Fourier value those correspond to a zero vector sum of the aligned first current Fourier value and the second current Fourier value are acquired during a time epoch when there is no fault or an out-of-area fault on the power line, and the first current Fourier value and the second current Fourier value those correspond to a non-zero vector sum of the aligned first current Fourier value and the second current Fourier value are acquired during a time epoch when there is an in-area fault on the power line.

2. The current recording method according to claim 1, applied to a current recording device, wherein by the current recording device, collecting the instantaneous value of the current at the first end of the power line, and converting the collected instantaneous value of the current into a Fourier value of the current to acquire the first current Fourier value;

by the current recording device, acquiring the second current Fourier value from an external device which is configured to collect the instantaneous value of the current at the second end of the power line and convert the collected instantaneous value of the current into a Fourier value of the current, via a communication channel between the current recording device and the external device, and storing the aligned first current Fourier value and second current Fourier value into the storage;

the first transmission delay is zero; and the second transmission delay is a transmission delay for the communication channel.

3. The current recording method according to claim 1, applied to a current recording system comprising a first current recording device, a second current recording device and a server, wherein by the server, acquiring the first current Fourier value from the first current recording device via a first communication channel between the server and the first current recording device, the first current recording device being configured to collect the instantaneous value of the current at the first end of the power line and convert the collected instantaneous value of the current into a Fourier value of the current as the first current Fourier value;

by the server, acquiring the second current Fourier value from the second current recording device via a second communication channel between the server and the second current recording device, the second current recording device being configured to collect the instantaneous value of the current at the second end of the power line and convert the collected instantaneous value of the current into a Fourier value of the current as the second current Fourier value;

by the server, time-aligning the first current Fourier value and the second current Fourier value, and storing the aligned first current Fourier value and second current Fourier value into the storage;

the first transmission delay is a transmission delay for the first communication channel; and the second transmission delay is a transmission delay for the second communication channel.

4. The current recording method according to claim 2, wherein the second transmission delay is determined by:

by the current recording device, transmitting a delay request signal to the external device via the communication channel, and storing a request transmission time at which the delay request signal is transmitted;

by the current recording device, receiving a delay response signal as a response to the delay request signal from the external device via the communication channel, and storing a delay reception time at which the delay response signal is received, the delay response signal including a request reception time at which the delay request signal is received by the external device and a response transmission time at which the delay response signal is transmitted by the external device; and determining, by the current recording device, half of a value obtained by a difference between the response reception time and the request transmission time subtracting a difference between the response transmission time and the request reception time, as the second transmission delay.

5. The current recording method according to claim 3, wherein the first transmission delay is obtained by:

by the server, transmitting a first delay request signal to the first current recording device via the first communication channel, and storing a first request transmission time at which the first delay request signal is transmitted;

by the server, receiving a first delay response signal transmitted by the first current recording device via the first communication channel, and storing a first response reception time at which the first delay response signal is received, the first delay response signal including a first request reception time at which the first delay request signal is received by the first current recording device and a first response transmission time at which the first delay response signal is transmitted by the first current recording device; and by the server, determining half of a value obtained by a difference between the first response reception time and the first request transmission time subtracting a difference between the first response transmission time and the first request reception time, as the first transmission delay; and the second transmission delay is obtained by:

by the server, transmitting a second delay request signal to the second current recording device via the second communication channel, and storing a second request transmission time at which the second delay request signal is transmitted;

by the server, receiving a second delay response signal transmitted by the second current recording device via the second communication channel, and storing a second response reception time at which the second delay response signal is received, the second delay response signal including a second request reception time at which the second delay request signal is received by the second current recording device and a second response transmission time at which the second delay response signal is transmitted by the second current recording device; and by the server, determining half of a value obtained by a difference between the second response reception time and the second request transmission time subtracting a difference between the second response transmission time and the second request reception time, as the second transmission delay.

6. The current recording method according to claim 1, further comprising:

detecting whether a vector sum of the aligned first current Fourier value and second current Fourier value starts to have a non-zero value from a certain time epoch, and storing only first current Fourier values and second current Fourier values which start from the time epoch.

7. The current recording method according to claim 1, further comprising:
acquiring a third current Fourier value, the third current Fourier value being a Fourier value acquired by Fourier transforming an instantaneous value of current at a third end of the power line;
time-aligning the first current Fourier value, the second current Fourier value, and the third current Fourier value, based on the first transmission delay for acquiring the first current Fourier value, the second transmission delay for acquiring the second current Fourier value, and a third transmission delay for acquiring the third current Fourier value; and
storing the aligned first current Fourier value, second current Fourier value, and third current Fourier value into the storage.

8. The current recording method according to claim 1, wherein
the Fourier transform is performed in units of instantaneous values for one or more cyclic waves of the current, and
the Fourier transform is performed once every L instantaneous values, wherein L is an integer greater than 2.

9. A current recording device, comprising:
an acquisition unit, configured to acquire a first current Fourier value and a second current Fourier value, the first current Fourier value being a Fourier value acquired by Fourier transforming an instantaneous value of current at a first end of a power line, the second current Fourier value being a Fourier value acquired by Fourier transforming an instantaneous value of current at a second end of the power line;
an alignment unit, configured to time-align the first current Fourier value and the second current Fourier value based on a first transmission delay for acquiring the first current Fourier value and a second transmission delay for acquiring the second current Fourier value; and
a storage unit, configured to store the aligned first current Fourier value and second current Fourier value,
wherein the first current Fourier value and the second current Fourier value those correspond to a zero vector sum of the aligned first current Fourier value and the second current Fourier value are acquired during a time epoch when there is no fault or an out-of-area fault on the power line, and the first current Fourier value and the second current Fourier value those correspond to a non-zero vector sum of the aligned first current Fourier value and the second current Fourier value are acquired during a time epoch when there is an in-area fault on the power line.

10. The current recording device according to claim 9, wherein
the acquisition unit is further configured to collect the instantaneous value of the current at the first end of the power line and convert the collected instantaneous value of the current into a Fourier value of the current to acquire the first Fourier value of the current; and
wherein the first transmission delay is zero.

11. The current recording device according to claim 9, further comprising:
a detection unit, configured to detect whether a vector sum of the aligned first current Fourier value and second current Fourier value starts to have a non-zero value from a certain time epoch, and
the storage unit stores only first current Fourier values and second current Fourier values which start from the time epoch.

12. A current recording system, comprising:
a first current recording device, a second current recording device and a server,
the first current recording device is configured to collect an instantaneous value of current at a first end of a power line, Fourier transform the collected instantaneous value into a first current Fourier value, and transmit the first current Fourier value to the server via a first communication channel between the first current recording device and the server;
the second current recording device is configured to collect an instantaneous value of current at a second end of the power line, Fourier transform the collected instantaneous value into a second current Fourier value, and transmit the second current Fourier value to the server via a second communication channel between the second current recording device and the server; and
the server is configured to time-align the first current Fourier value and the second current Fourier value based on a transmission delay for the first communication channel and a transmission delay for the second communication channel, and store the aligned first current Fourier value and second current Fourier value into a storage of the server,
wherein the first current Fourier value and the second current Fourier value those correspond to a zero vector sum of the aligned first current Fourier value and the second current Fourier value are acquired during a time epoch when there is no fault or an out-of-area fault on the power line, and the first current Fourier value and the second current Fourier value those correspond to a non-zero vector sum of the aligned first current Fourier value and the second current Fourier value are acquired during a time epoch when there is an in-area fault on the power line.

13. The current recording system according to claim 12, wherein
the server is further configured to detect whether a vector sum of the aligned first current Fourier value and second current Fourier value starts to have a non-zero value from a certain time epoch, and store only first current Fourier values and second current Fourier values which start from the time epoch.

* * * * *